(12) United States Patent
Kuo et al.

(10) Patent No.: US 8,701,052 B1
(45) Date of Patent: Apr. 15, 2014

(54) METHOD OF OPTICAL PROXIMITY CORRECTION IN COMBINATION WITH DOUBLE PATTERNING TECHNIQUE

(71) Applicant: United Microelectronics Corp., Hsin-Chu (TW)

(72) Inventors: Hui-Fang Kuo, Tainan (TW); Ming-Jui Chen, Hsinchu (TW); Cheng-Te Wang, Hsinchu County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/748,564

(22) Filed: Jan. 23, 2013

(51) Int. Cl.
G06F 17/50 (2006.01)

(52) U.S. Cl.
USPC ............................ 716/52; 716/51; 716/53

(58) Field of Classification Search
USPC ..................................................... 716/51–53
See application file for complete search history.

(56) References Cited

U.S. PATENT DOCUMENTS

| | | | |
|---|---|---|---|
| 5,245,470 A | 9/1993 | Keum | |
| 5,446,669 A | 8/1995 | Yamashita | |
| 5,602,644 A | 2/1997 | Ota | |
| 5,689,339 A | 11/1997 | Ota | |
| 5,716,763 A | 2/1998 | Benoit | |
| 5,807,439 A | 9/1998 | Akatsu | |
| 6,033,811 A | 3/2000 | Lee | |
| 6,275,744 B1 | 8/2001 | Yoshida | |
| 6,286,524 B1 | 9/2001 | Okuchi | |
| 6,395,438 B1 | 5/2002 | Bruce | |
| 6,470,489 B1 | 10/2002 | Chang | |
| 6,509,971 B2 | 1/2003 | Inoue | |
| 6,566,021 B2 | 5/2003 | Wang | |
| 6,684,382 B2 | 1/2004 | Liu | |
| 6,724,463 B2 | 4/2004 | Taniguchi | |
| 6,753,115 B2 | 6/2004 | Zhang | |
| 6,763,514 B2 | 7/2004 | Zhang | |
| 6,781,670 B2 | 8/2004 | Krautschik | |
| 6,788,477 B2 | 9/2004 | Lin | |
| 6,795,169 B2 | 9/2004 | Tanaka | |
| 6,815,664 B2 | 11/2004 | Wang | |
| 6,852,453 B2 | 2/2005 | Wu | |
| 6,867,844 B2 | 3/2005 | Vogel | |
| 6,891,596 B2 | 5/2005 | Rostalski | |
| 6,961,920 B2 | 11/2005 | Zach | |
| 6,979,822 B1 | 12/2005 | Stewart | |
| 7,090,963 B2 | 8/2006 | Medeiros | |
| 7,150,945 B2 | 12/2006 | Mackey | |
| 7,247,887 B2 | 7/2007 | King | |
| 7,386,829 B2 | 6/2008 | Lee | |

(Continued)

Primary Examiner — Naum Levin
(74) Attorney, Agent, or Firm — Winston Hsu; Scott Margo (57) ABSTRACT

A method of optical proximity correction (OPC) includes the following steps. A layout pattern is provided to a computer system, and the layout pattern is classified into at least a first sub-layout pattern and at least a second sub-layout pattern. Then, at least an OPC calculation is performed respectively on the first sub-layout pattern and the second sub-layout pattern to form a corrected first sub-layout pattern and a corrected second sub-layout pattern. The corrected first sub-layout pattern/the corrected second sub-layout pattern and the layout pattern are compared to select a part of the corrected first sub-layout pattern/the corrected second sub-layout pattern as a first selected pattern/the second selected pattern, and the first selected pattern/the second selected pattern is further altered to modify the corrected first sub-layout pattern/the corrected second sub-layout pattern as a third sub-layout pattern/a fourth sub-layout pattern.

11 Claims, 7 Drawing Sheets

(56) References Cited

U.S. PATENT DOCUMENTS

| | | |
|---|---|---|
| 7,624,369 B2 | 11/2009 | Graur |
| 7,873,935 B2 * | 1/2011 | Jung et al. .................. 716/53 |
| 8,064,681 B2 * | 11/2011 | Okai et al. .................. 382/141 |
| 8,111,921 B2 | 2/2012 | Hsu |
| 8,132,130 B2 | 3/2012 | Chen |
| 8,245,180 B2 * | 8/2012 | Smayling et al. ............. 716/138 |
| 8,383,299 B2 * | 2/2013 | Hsieh et al. .................. 430/5 |
| 8,391,605 B2 * | 3/2013 | Hsu et al. .................. 382/181 |
| 8,404,403 B2 * | 3/2013 | Ogadhoh et al. ............. 430/5 |
| 2005/0048223 A1 | 3/2005 | Pawloski |
| 2005/0175940 A1 | 8/2005 | Dierichs |
| 2005/0233081 A1 | 10/2005 | Tokita |
| 2005/0266354 A1 | 12/2005 | Li |
| 2006/0023184 A1 | 2/2006 | Coon |
| 2006/0066339 A1 | 3/2006 | Rajski |
| 2006/0085772 A1 | 4/2006 | Zhang |
| 2006/0161452 A1 | 7/2006 | Hess |
| 2006/0188804 A1 | 8/2006 | Allen |
| 2007/0020565 A1 | 1/2007 | Koh |
| 2007/0072090 A1 | 3/2007 | Chang |
| 2007/0158756 A1 | 7/2007 | Dreeskornfeld |
| 2007/0215040 A1 | 9/2007 | Huang |
| 2008/0010628 A1 * | 1/2008 | Jung et al. .................. 716/19 |
| 2008/0067335 A1 | 3/2008 | Hou |
| 2008/0069432 A1 | 3/2008 | Hsu |
| 2008/0248429 A1 | 10/2008 | Chou |
| 2009/0191723 A1 | 7/2009 | Huang |
| 2009/0193385 A1 | 7/2009 | Yang |
| 2009/0217224 A1 * | 8/2009 | Wiaux et al. .................. 716/5 |
| 2009/0233238 A1 | 9/2009 | Hsu |
| 2009/0258500 A1 | 10/2009 | Yang |
| 2009/0278569 A1 | 11/2009 | Taoka |
| 2009/0300576 A1 | 12/2009 | Huang |
| 2010/0036644 A1 | 2/2010 | Yang |
| 2010/0070944 A1 | 3/2010 | Wu |
| 2010/0086862 A1 | 4/2010 | Yang |
| 2010/0131914 A1 | 5/2010 | Wu |
| 2010/0175041 A1 | 7/2010 | Krasnoperova |
| 2011/0029939 A1 | 2/2011 | Yang |
| 2011/0318672 A1 * | 12/2011 | Ogadhoh et al. ............. 430/5 |
| 2012/0319287 A1 * | 12/2012 | Huang et al. .................. 257/773 |
| 2013/0024824 A1 * | 1/2013 | Huang et al. .................. 716/53 |

\* cited by examiner

METHOD OF OPTICAL PROXIMITY CORRECTION IN COMBINATION WITH DOUBLE PATTERNING TECHNIQUE

BACKGROUND OF THE INVENTION

1. Field of the Invention

The present invention relates to a method of optical proximity correction (OPC), and more particularly, to a method of OPC including modifying a corrected layout pattern according to an original layout pattern, wherein the corrected layout pattern is the layout pattern modified through the OPC method.

2. Description of the Prior Art

In semiconductor manufacturing processes, the integrated circuit layout is first designed and formed as a mask pattern. The mask pattern is then proportionally transferred to a target layer such as photoresist layer disposed on the semiconductor wafer through an exposure process followed by a development process. Subsequently, a corresponding etching process is performed in order to manufacture the semiconductor devices on the semiconductor wafer.

With the demands of increasing integration and decreasing size of the semiconductor devices, the critical dimension (CD) of each segment fabricated through exposure is limited to the resolution limit of the optical exposure tool used for transferring the mask pattern. A problem that easily arises during the exposures of a mask pattern with high-density arranged segments to form a pattern on a photoresist is the optical proximity effect. Such a resolution loss occurs because of overexposure or underexposure, which brings a deviation of the pattern on the photoresist layer from the original mask pattern.

Many saving methods have been used to avoid the deviation caused by the optical proximity effect in order to improve the quality of the transferred pattern. The most popular method is the optical proximity correction (OPC). And there is a variety of commercial optical proximity correction softwares that can theoretically correct the mask patterns to be more accurately transferred on a wafer. Additionally, the double patterning technique (DPT) has been developed and taken as one of the most promising lithographic technologies for 32 nanometer (nm) node and 22 nm node patterning processes for overcoming the limitations of the conventional optical exposure tools. The DPT includes a photolithography-etch-photolithography-etch approach, also called 2P2E, or a photolithography-photolithography-etch approach, also called 2P1E. The first photolithography process and the second photolithography process are performed to form the respective patterns in the target layer through different masks, which may jointly form the predetermined layout pattern.

In the illustrated DPT, the original layout pattern is usually divided into two different masks, and a pattern density of the pattern predetermined to be formed in each of the photolithography processes is different from a pattern density of the original layout pattern; so the OPC methods respectively performed on the patterns of the two different masks may therefore cause excessive adjustment on the mask patterns, and the patterns later formed in the target layer through the two masks may not be combined to form the accurate layout pattern. For example, an unexpected bridge can be formed. Consequently, how to improve the method of optical proximity correction (OPC) to form the accurate layout pattern, is still an important issue in the field.

SUMMARY OF THE INVENTION

An objective of the present invention is therefore to provide a method of optical proximity correction (OPC) that increases the accuracy of the mask patterns, so that a predetermined layout pattern can be further formed.

According to one exemplary embodiment of the present invention, a method of optical proximity correction (OPC) includes the following steps. At first, a layout pattern is provided to a computer system. Subsequently, the layout pattern is classified into at least a first sub-layout pattern and at least a second sub-layout pattern. Then, at least an OPC calculation is respectively performed on the first sub-layout pattern and the second sub-layout pattern to form a corrected first sub-layout pattern and a corrected second sub-layout pattern. Furthermore, the corrected first sub-layout pattern and the layout pattern are compared to select a part of the corrected first sub-layout pattern as a first selected pattern, and the first selected pattern is further altered to modify the corrected first sub-layout pattern as a third sub-layout pattern. Similarly, the corrected second sub-layout pattern and the layout pattern are compared to select a part of the corrected second sub-layout pattern as a second selected pattern, and the second selected pattern is further altered to modify the corrected second sub-layout pattern as a fourth sub-layout pattern. Afterwards, the third sub-layout pattern and the fourth sub-layout pattern are respectively outputted through the computer system onto a first mask and a second mask.

The characteristic of the present invention is illustrated below. An inspection step is further performed on the layout pattern which has been processed by the OPC method (i.e. the corrected sub-layout pattern). More specifically, the corrected layout pattern is compared with the original layout pattern, and some patterns having excessive adjustments due to the OPC method would be selected. Moreover, the selected patterns are further altered; for example, the adjustment of the selected pattern may be reduced. Accordingly, the mis-adjustment due to the OPC method can be avoided, the accuracy of the mask patterns can be increased, and a predetermined layout pattern can be further formed.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
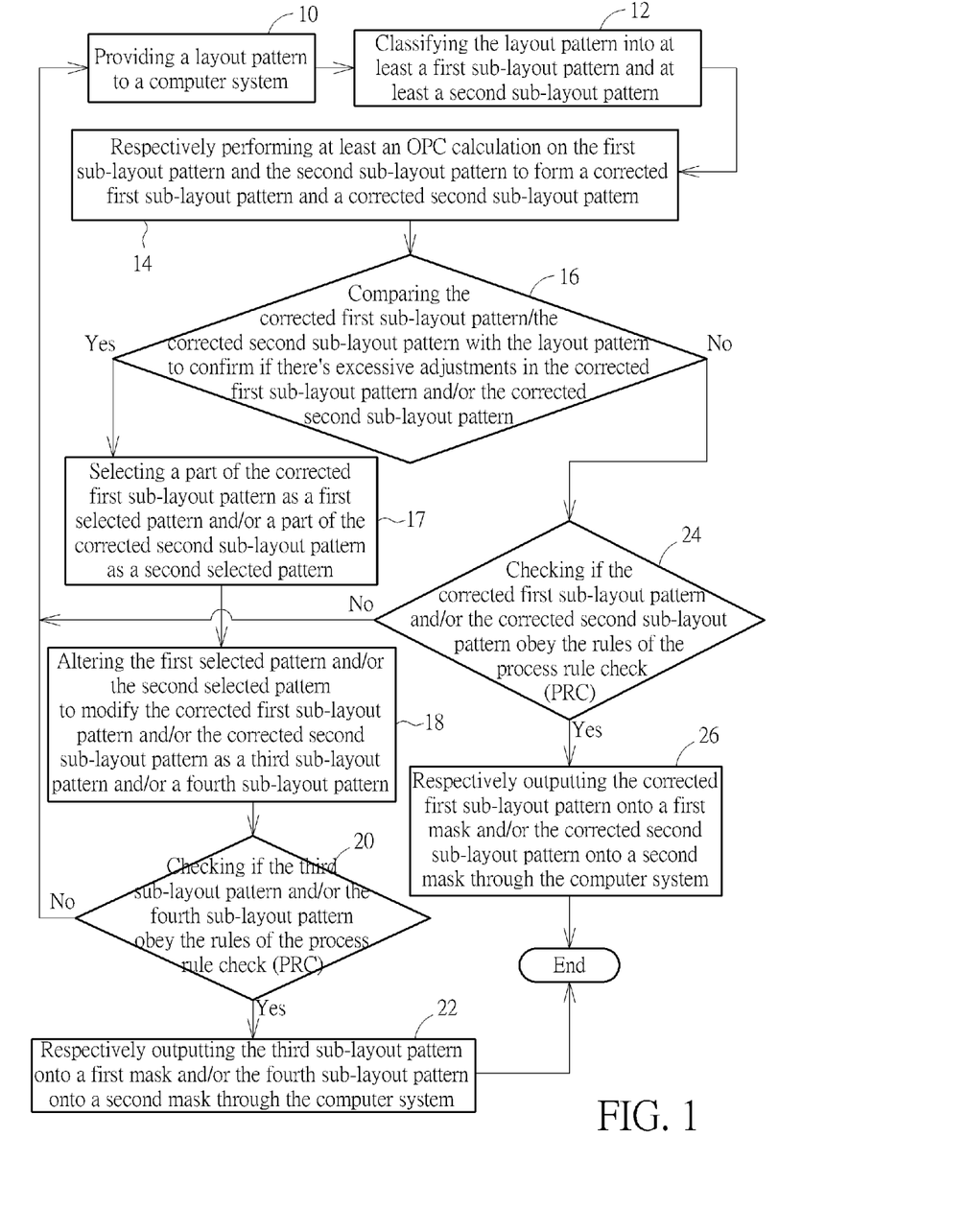
FIG. 1 is a flow chart illustrating a method of optical proximity correction (OPC) according to a preferred exemplary embodiment of the present invention.

Please refer to FIG. 1, which is a flow chart illustrating a method of optical proximity correction (OPC) according to a preferred exemplary embodiment of the present invention. As shown in FIG. 1, a layout pattern is first provided to a data base of a computer system, as shown in step 10. The layout pattern is an ideal pattern supposed to be later transferred on a mask or a target layer such as a photoresist layer on a wafer, which may include feature patterns used to construct integrated circuits (IC) such as doped region patterns, device patterns, or layout of circuits. In this exemplary embodiment, the layout pattern includes at least a line segment used to form the gate patterns or the metal interconnection patterns. In order to achieve high integration rates, the spaces between each of the patterns in the layout pattern are required to be continuously reduced, so that the layout pattern may not be directly formed through the conventional optical exposure tools. Meanwhile, the double patterning technique (DPT) can be utilized to solve the illustrated problem. The layout pattern is therefore classified into at least a first sub-layout pattern and at least a second sub-layout pattern through the computer system, as shown in step 12. The patterns of the first sub-layout pattern and the patterns of the second sub-layout pattern are substantially arranged alternatively and parallel to a common direction. Moreover, the space between each of the patterns of the first sub-layout pattern and each of the patterns of the second sub-layout pattern is larger than the resolution limit of the optical exposure tool, i.e. the smallest distance between the patterns that could be resolved through exposure process and development process.

Subsequently, at least an optical proximity correction (OPC) calculation is respectively performed on the first sub-layout pattern and the second sub-layout pattern to respectively form a corrected first sub-layout pattern and a corrected second sub-layout pattern, as shown in step 14. The OPC calculation includes the following steps. The line width, the pattern density and the relative position of each of the geometric patterns of the first sub-layout pattern and the second sub-layout pattern are first collected and further compared with the correction standard in the data base. Subsequently, the correction value, i.e. the adjustment of each of the geometric patterns, can be calculated to correct the line width, the line end or the corner of the line segment of each of the geometric patterns. The usual way of correcting the patterns includes the adjustment of the line width of the line segment, and the disposition of assist patterns such as serif or hammerhead patterns at the line end or the corner, which may avoid the deviation of the transferred patterns, such as rounded right-angle corners, shortened line-ends, or increasing/decreasing of the line widths when the mask patterns are later transferred onto the target layer, such as the photoresist layer on the wafer.

It is appreciated that the first sub-layout pattern and the second sub-layout pattern only respectively include a part of the layout pattern, i.e. different from the original complete layout pattern. In other words, after the performance of the optical proximity correction (OPC) calculation, the adjustment in the corrected first sub-layout pattern and the adjustment in the corrected second sub-layout pattern may be different from the adjustment in the corrected layout pattern. In order to further check the accuracy of the corrected first sub-layout pattern and the corrected second sub-layout pattern, in this exemplary embodiment, a first inspection step is performed to compare the corrected first sub-layout pattern with the layout pattern and to compare the corrected second sub-layout pattern with the layout pattern to check the difference between the corrected first sub-layout pattern and the layout pattern and the difference between the corrected second sub-layout pattern and the layout pattern, to confirm if there's excessive adjustments in the corrected first sub-layout pattern and/or the corrected second sub-layout pattern, as shown in step 16. If yes, as shown in step 17, a part of the corrected first sub-layout pattern and/or a part of the corrected second sub-layout pattern having large differences can be selected as a first selected pattern and/or a second selected pattern. For example, the corrected first sub-layout pattern and the second layout pattern not processed by the OPC calculation (i.e. the second layout pattern in the original layout pattern) are compared through a simulation model, an interval between a pattern of the corrected first sub-layout pattern and a pattern of the second layout pattern not processed by the OPC calculation is calculated, then, as the interval is smaller than a predetermined value, or the pattern of the corrected first sub-layout pattern overlaps a pattern of the second layout pattern, the pattern of the corrected first sub-layout pattern is selected as a first selected pattern. Furthermore, a second selected pattern can be selected in a similar way.

As shown in step 18, the first selected pattern and/or the second selected pattern are further altered to reduce the excessive adjustment caused by the performance of the OPC calculation, respectively. The corrected first sub-layout pattern is modified to serve as a third sub-layout pattern and/or the corrected second sub-layout pattern is modified to serve as a fourth sub-layout pattern. For example, the first selected pattern/the second selected pattern can be rolled back as a part of the first sub-layout pattern/the second sub-layout pattern not yet corrected by the OPC calculation, or the adjustment of the first selected pattern/the second selected pattern can be directly decreased so that a boundary of the first selected pattern/the second selected pattern can become closer to a boundary of the original first sub-layout pattern/the original second sub-layout pattern.

As shown in step 20, a second inspection step is performed to check if the sub-layout patterns that are corrected by the OPC calculation and checked by the first inspection step, such as the third sub-layout pattern and/or the fourth sub-layout pattern, obey the rules of the process rule check (PRC), in order to further confirm the accuracy of the sub-layout pattern. For example, a process rule is inputted through a modeling mode of the computer system, and the process rule check inspects line ends and corners of each segment of the third sub-layout pattern and the fourth sub-layout pattern in order to verify that those geometrical patterns obey the limitation of the critical dimension (critical width) and the critical space of the designed integrated circuit layout. If the third sub-layout pattern and the fourth sub-layout pattern completely obey the rules of the process rule check, the pattern of the third sub-layout pattern and the pattern of the fourth sub-layout pattern are then respectively outputted onto a first mask and a second mask. Conversely, if a part of, or all portions of the third sub-layout pattern and the fourth sub-layout pattern violate the rules of process rule check, the third sub-layout pattern and/or the fourth sub-layout pattern can be partially or overall modified through the computer system as illustrated in the flow chart. Finally, as shown in step 22, the third sub-layout pattern is outputted onto a first mask and/or the fourth sub-layout pattern is outputted onto a second mask through the computer system.

Similarly, after the first inspection step of step 16 is performed, if the corrected first sub-layout pattern and/or the corrected second sub-layout pattern do not include excessive adjustments, the second inspection step as illustrated in step 20 can be performed to check if the corrected first sub-layout pattern and/or the corrected second sub-layout pattern obey the rules of the process rule check (PRC), as shown in step 24. If yes, the pattern of the corrected first sub-layout pattern and/or the corrected second sub-layout pattern are then respectively outputted onto a first mask and/or a second mask, as shown in step 26. Conversely, the corrected first sub-layout pattern and/or the corrected second sub-layout pattern can be partially or overall modified through the computer system as illustrated in the flow chart.

Figure 2:
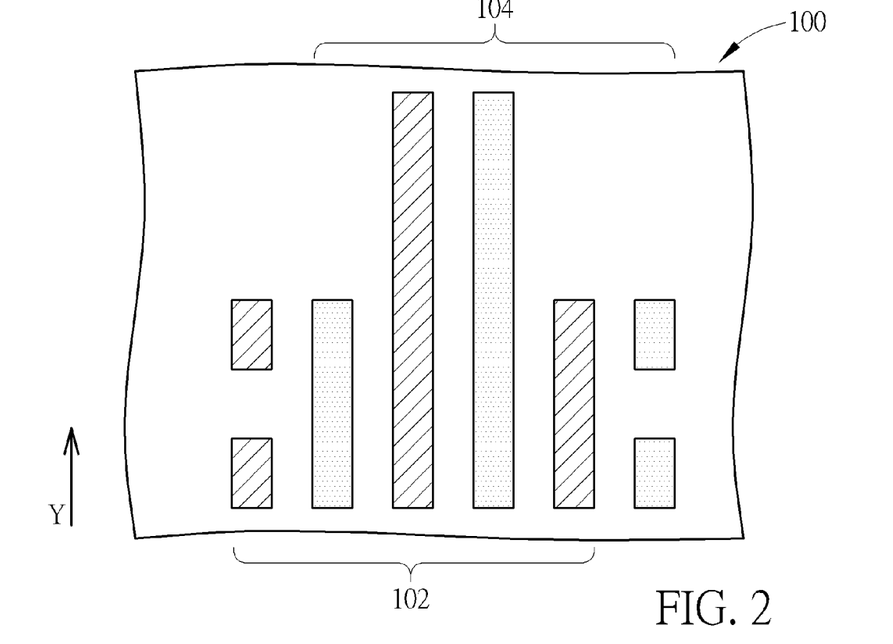
FIG. 2 through FIG. 8 are schematic diagrams illustrating a method of optical proximity correction (OPC) according to a preferred exemplary embodiment of the present invention.

To more specifically explain the illustrated steps, please refer to FIG. 2 through FIG. 8, which are schematic diagrams illustrating a method of optical proximity correction (OPC) according to a preferred exemplary embodiment of the present invention. As shown in FIG. 2, a layout pattern 100 is provided to a storage medium such as a computer system (not shown), then, the layout pattern 100 is classified into at least a first sub-layout pattern 102 marked by slanting lines and at least a second sub-layout pattern 104 marked by dots. Each of the patterns of the first sub-layout pattern 102 and each of the patterns of the second sub-layout pattern 104 are substantially arranged alternatively and parallel to a common direction Y. Furthermore, the space between each of the patterns of the first sub-layout pattern 102 and each of the patterns of the second sub-layout pattern 104 is larger than the resolution limit of the optical exposure tool, i.e. the smallest distance between the patterns that could be resolved through exposure process and development process.

Figure 3:
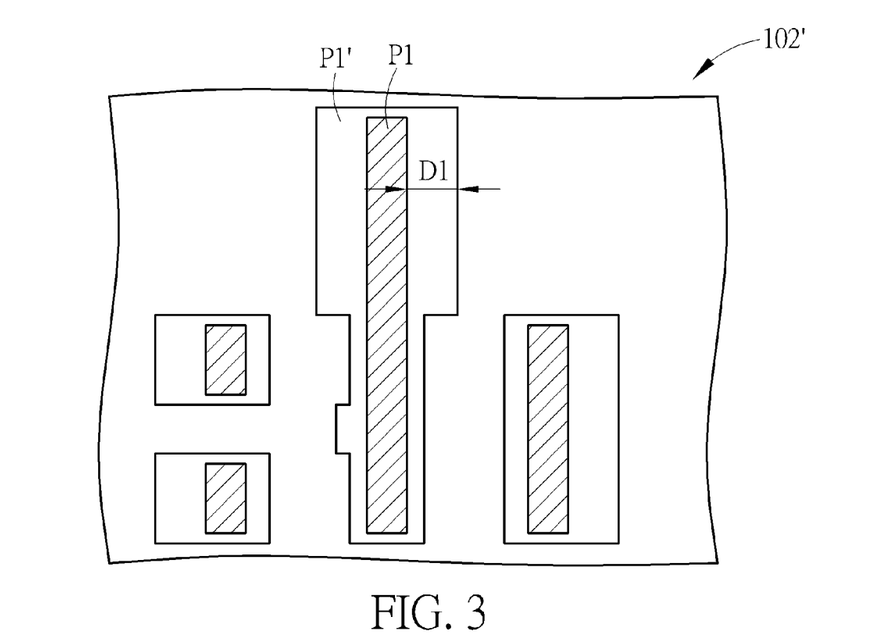
Figure 4:
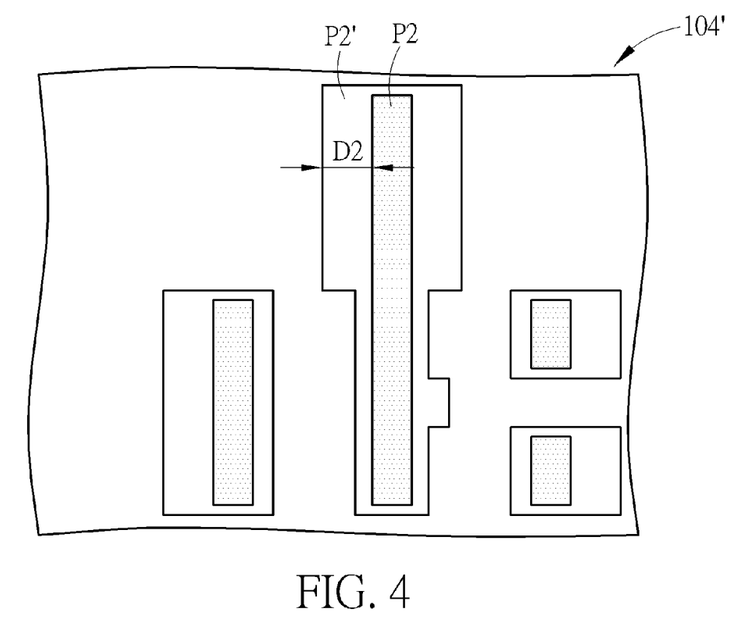

Subsequently, at least an OPC calculation is respectively performed on the first sub-layout pattern 102 and the second sub-layout pattern 104 to form a corrected first sub-layout pattern 102' and a corrected second sub-layout pattern 104', as shown in FIG. 3 and FIG. 4. An interval D1/D2 between a line segment of the corrected pattern P1'/P2' and a line segment of the original pattern P1/P2, i.e. the adjustment provided by the performance of the OPC calculation, positively correspond to the distribution status of the neighboring patterns. The interval D1 between a line segment of the corrected pattern P1' and a line segment of the original pattern P1, as shown in FIG. 3, is taken for example. Since there is no neighboring pattern at the upper right side of the original pattern P1 and since a neighboring pattern is located at the lower right side of the original pattern P1, the interval D1 at the upper right side of the corrected pattern P1' may be larger than the interval D1 at the lower right side of the corrected pattern P1' after the performance of the OPC calculation. Similarly, as shown in FIG. 4, the interval D2 at the upper left side of the corrected pattern P2' may be larger than the interval D2 at the lower left side of the corrected pattern P2'.

Figure 5:
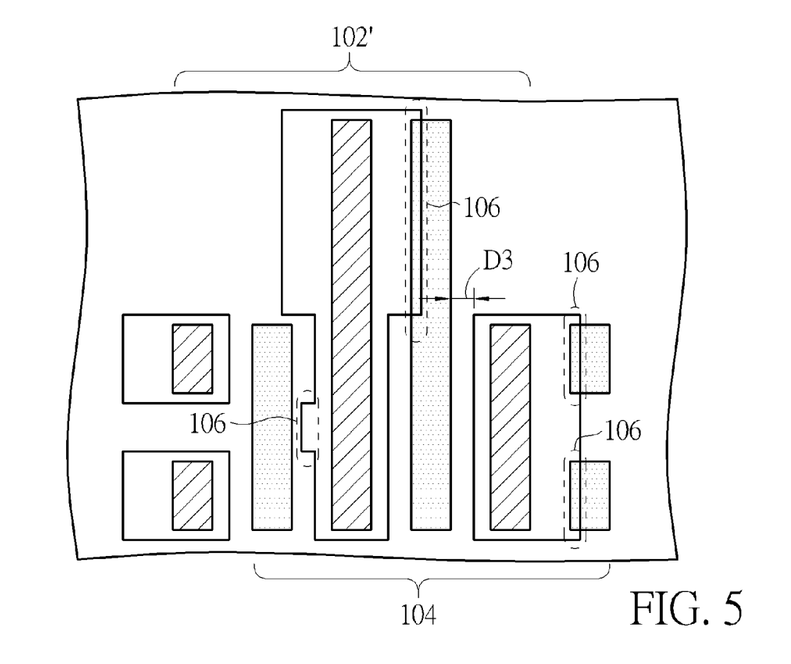

As shown in FIG. 5, the corrected first sub-layout pattern 102' and the non-corrected second layout pattern 104 are compared through the computer system. An interval D3 between a pattern of the corrected first sub-layout pattern 102' and a pattern of the second layout pattern 104 is calculated, and the pattern of the corrected first sub-layout pattern 102' having the interval D3 smaller than a predetermined value, such as a half of the critical space, is selected as a first selected pattern 106. In another aspect, if a pattern of the corrected first sub-layout pattern 102' overlapping a pattern of the second layout pattern 104 is spotted, then the pattern of the corrected first sub-layout pattern 102' overlapping the pattern of the second layout pattern 104 is selected as the second selected pattern 106 as well.

Figure 6:
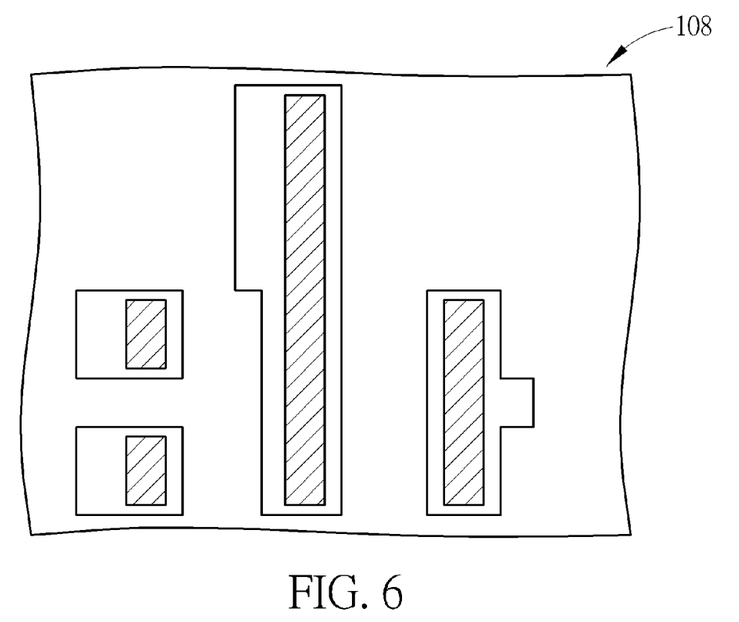

As shown in FIG. 6, a part of the corrected first sub-layout pattern 102', i.e. the first selected pattern 106, is altered. In this exemplary embodiment, the adjustment of the first selected pattern 106 is reduced. That is, a boundary of the first selected pattern 106 may get closer to a boundary of the original first sub-layout pattern 102 and, preferably, the adjustment of the first selected pattern 106 is reduced to be the same as the adjustment of the pattern of the corrected first sub-layout pattern 102' neighboring and connecting the first selected pattern 106, while the other patterns of the corrected first sub-layout pattern 102' (except for the first selected pattern 106) keep the original adjustment. Therefore, the corrected first sub-layout pattern 102' is modified as a third sub-layout pattern 108.

Figure 7:
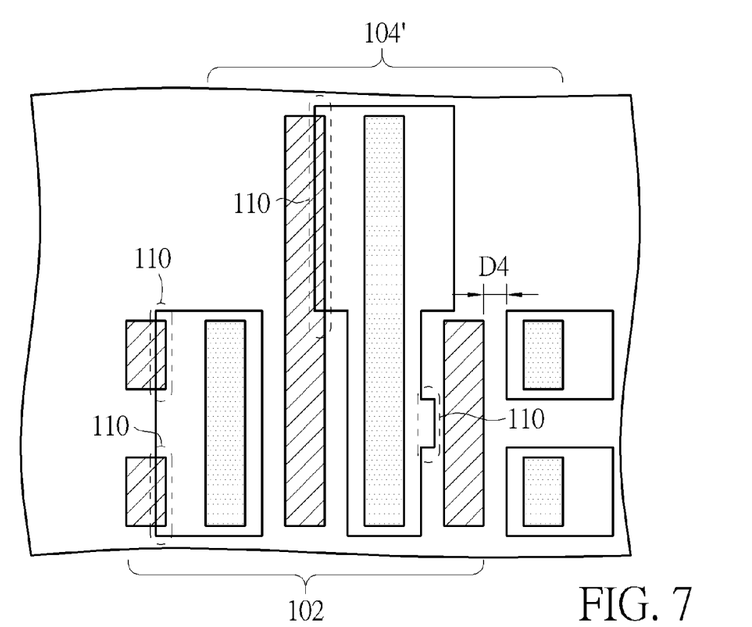

Similarly, as shown in FIG. 7, the corrected second sub-layout pattern 104' and the non-corrected first layout pattern 102 are compared through the computer system. An interval D4 between a pattern of the corrected second sub-layout pattern 104' and a pattern of the first layout pattern 102 is calculated, and the pattern of the corrected second sub-layout pattern 104' having the interval D4 smaller than a predetermined value, such as a half of the critical space, is selected as the second selected pattern 110. In another aspect, if a pattern of the corrected second sub-layout pattern 104' overlapping a pattern of the first layout pattern 102 is spotted, then the pattern of the corrected second sub-layout pattern 104' overlapping the pattern of the first layout pattern 102 is selected as the second selected pattern 110 as well.

Figure 8:
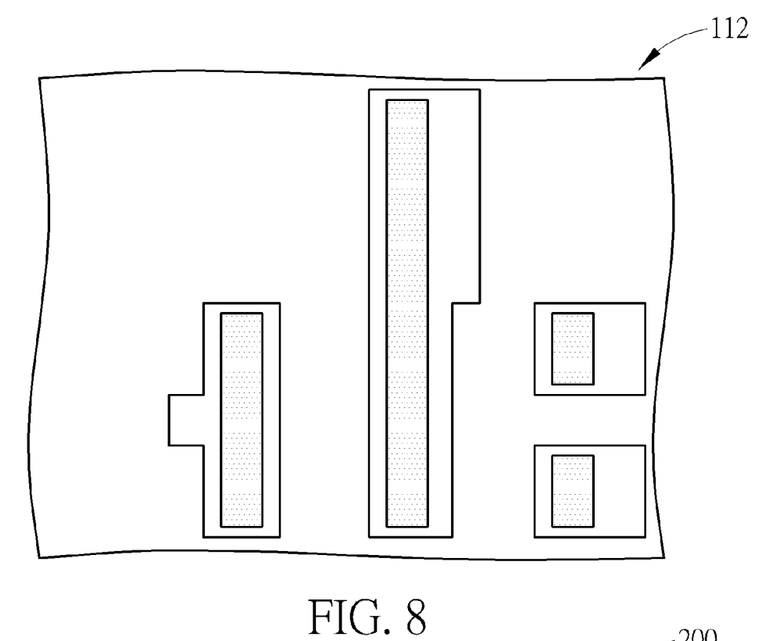

As shown in FIG. 8, a part of the corrected second sub-layout pattern 104', i.e. the second selected pattern 110, is altered. In this exemplary embodiment, the adjustment of the second selected pattern 110 is reduced. That is, a boundary of the second selected pattern 110 may get closer to a boundary of the original second sub-layout pattern 104 and, preferably, the adjustment of the second selected pattern 110 is reduced to be the same as the adjustment of the pattern of the corrected second sub-layout pattern 104' neighboring and connecting the second selected pattern 110, while the other patterns of the corrected second sub-layout pattern 104' (except for the second selected pattern 110) keep the original adjustment. Therefore, the corrected second sub-layout pattern 104' is modified as a fourth sub-layout pattern 112.

Afterwards, the process rule check (PRC) step is performed. If the third sub-layout pattern 108 and the fourth sub-layout pattern 112 obey the rules of the PRC, the third sub-layout pattern 108 and the fourth sub-layout pattern 112 may be respectively outputted through the computer system to form a first mask (not shown) and a second mask (not shown).

In other exemplary embodiments, the corrected first sub-layout pattern 102' and the corrected second sub-layout pattern 104' can be directly compared. An interval between a pattern of the corrected first sub-layout pattern 102' and a pattern of the corrected second sub-layout pattern 104' is calculated, and the pattern of the corrected first sub-layout pattern 102' and the pattern of the corrected second sub-layout pattern 104' having the interval smaller than a predetermined value, such as a half of the critical space, are respectively selected as the first selected pattern and the second selected pattern. Furthermore, if a pattern of the corrected first sub-layout pattern 102' overlapping a pattern of the corrected second sub-layout pattern 104' is checked, then the pattern of the corrected first sub-layout pattern 102' and the pattern of the corrected second sub-layout pattern 104' overlapping each other are respectively selected as the first selected pattern and the second selected pattern. Then, similarly, the first selected pattern and the second selected pattern are altered to reduce the adjustment of the first selected pattern and the adjustment of the second selected pattern. Accordingly, the corrected first sub-layout pattern 102' can be modified as a third sub-layout pattern, and the corrected second sub-layout pattern 104' can be modified as a fourth sub-layout pattern.

Figure 9:
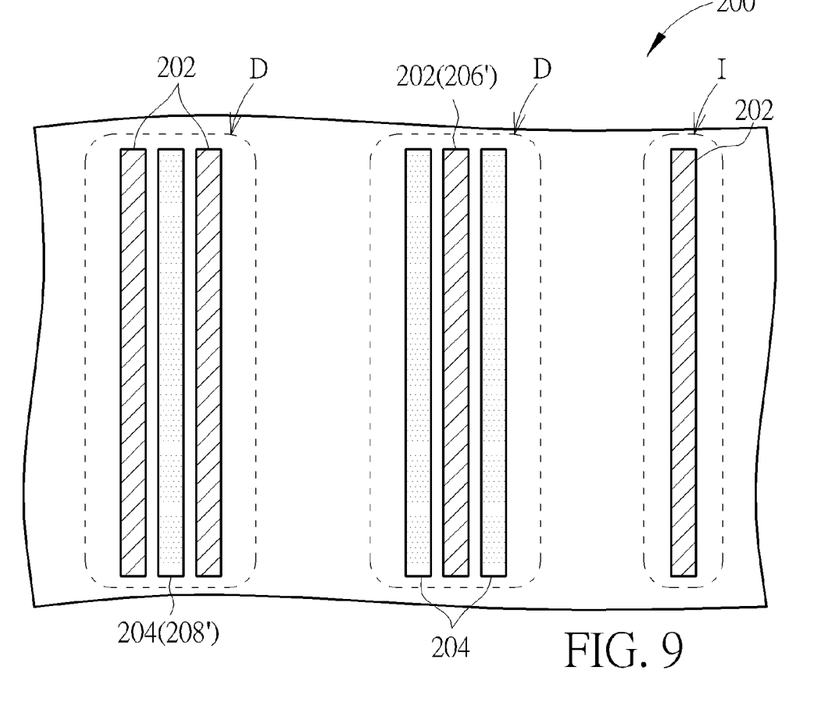
FIG. 9 through FIG. 13 are schematic diagrams illustrating a method of optical proximity correction (OPC) according to another preferred exemplary embodiment of the present invention.

The method of checking the differences between the corrected first sub-layout pattern and the layout pattern and the differences between the corrected second sub-layout pattern and the layout pattern is not limited to the one illustrated above. Please refer to FIG. 9 through FIG. 13, which are schematic diagrams illustrating a method of optical proximity correction (OPC) according to another preferred exemplary embodiment of the present invention. As shown in FIG. 9, a layout pattern 200 is provided to a storage medium such as a computer system (not shown); then, the layout pattern 200 is classified into at least a dense region D and at least an isolated region I according to the pattern density of the distributed geometric patterns. More specifically, the region having more patterns per unit area can be defined as the dense region D, while the region having less patterns per unit area can be defined as isolated region I, i.e. a pattern density of the layout pattern 200 of the dense region D is substantially larger than a pattern density of the layout pattern 200 of the isolated region I. The distance between two neighboring patterns in the dense region D is smaller than the distance between two neighboring patterns in the isolated region I. In order to achieve high integration rates, the spaces between each of the patterns in the layout pattern 200 are required to be continuously reduced, so that the layout pattern 200 in the dense region D may not be directly formed through the conventional optical exposure tools.

Figure 10:
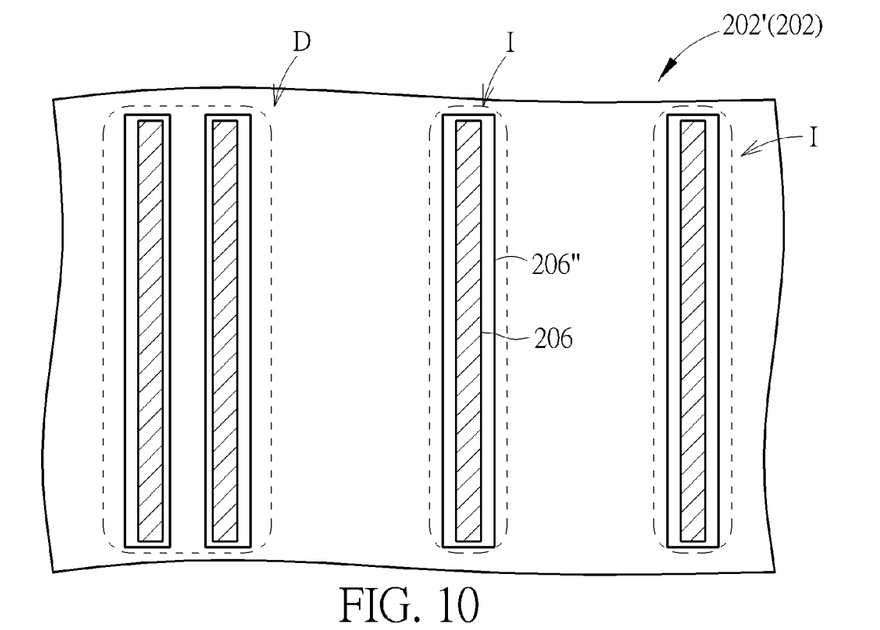
Figure 11:
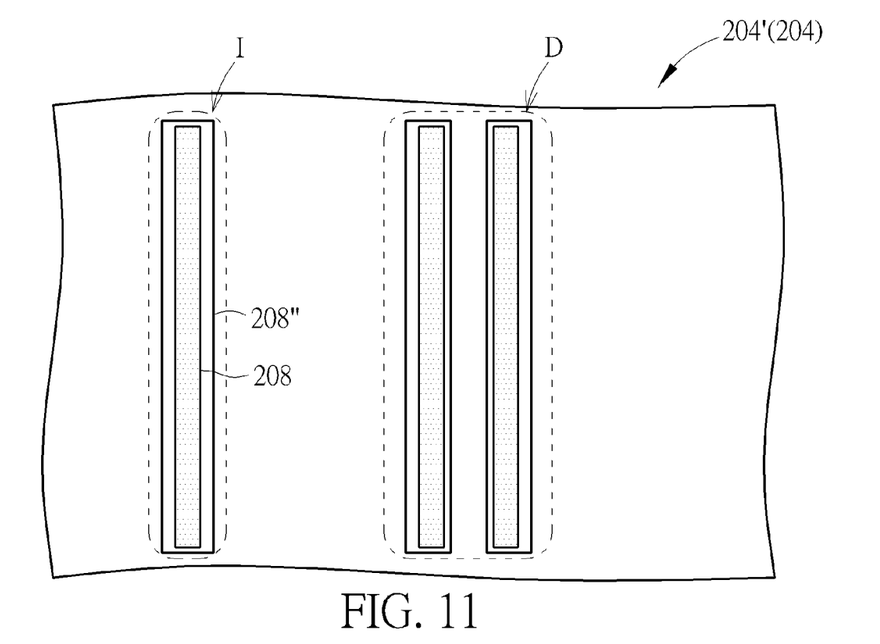

Meanwhile, the double patterning technique (DPT) can be utilized to solve the illustrated problem. The layout pattern 200 is therefore classified into at least a first sub-layout pattern 202 marked by slanting lines and at least a second sub-layout pattern 204 marked by dots through the computer system. The space between each of the patterns of the first sub-layout pattern 202 and each of the patterns of the second sub-layout pattern 204 can be larger than the resolution limit of the optical exposure tool, i.e. the smallest distance between the patterns that could be resolved through exposure process and development process. As shown in FIG. 10 and FIG. 11, the same method of classifying the layout pattern 200 into the dense region D and the isolated region I is used to respectively classify the first sub-layout pattern 202 and the second sub-layout pattern 204 into at least a dense region D and at least an isolated region I.

Subsequently, at least a pattern of the first sub-layout pattern 202 in the isolated region I is compared with at least a pattern of the layout pattern 200 in the dense region D to find a same pattern, such as the pattern 206. The space between the pattern 206 and one of its neighboring patterns in the first sub-layout pattern 202 is larger than the space between the pattern 206 and one of its neighboring patterns in the original layout pattern 200, which may cause unexpected adjustment in the later corrected first sub-layout pattern. In other exemplary embodiments, at least a pattern of the first sub-layout pattern 202 in the isolated region I can be compared with at least a pattern corresponding to the first sub-layout pattern 202 and in the dense region D of the layout pattern 200, without being compared with the patterns corresponding to the second sub-layout pattern 204 and in the dense region D of the layout pattern 200, in order to save the loading and processing time of the computer system.

Similarly, at least a pattern of the second sub-layout pattern 204 in the isolated region I is compared with at least a pattern of the layout pattern 200 in the dense region D to find a same pattern, such as the pattern 208. The space between the pattern 208 and one of its neighboring patterns in the second sub-layout pattern 204 is larger than the space between the pattern 208 and one of its neighboring patterns in the original layout pattern 200, which may cause unexpected adjustment in the later corrected second sub-layout pattern. In other exemplary embodiments, at least a pattern of the second sub-layout pattern 204 in the isolated region I can be compared with at least a pattern corresponding to the second sub-layout pattern 204 and in the dense region D of the layout pattern 200, without being compared with the patterns corresponding to the first sub-layout pattern 202 and in the dense region D of the layout pattern 200, in order to save the loading and processing time of the computer system.

Afterwards, at least an OPC calculation is performed respectively on the first sub-layout pattern 202 and the second sub-layout pattern 204 to form a corrected first sub-layout pattern 202' and a corrected second sub-layout pattern 204'. It is appreciated that the pattern 206/208 of the first sub-layout pattern 202/the second sub-layout pattern 204 is in the isolated region I. However, the original pattern 206'/208' of the layout pattern 200 is in the dense region D. In other words, after the performance of the OPC calculation, the adjustment status of the pattern 206/208 may be different form the predetermined adjustment status of original pattern 206'/208'. Accordingly, a part of the corrected first sub-layout pattern 202' corresponding to the pattern 206 is selected as the first selected pattern 206", and a part of the corrected second sub-layout pattern 204' corresponding to the pattern 208 is selected as the second selected pattern 208".

Figure 12:
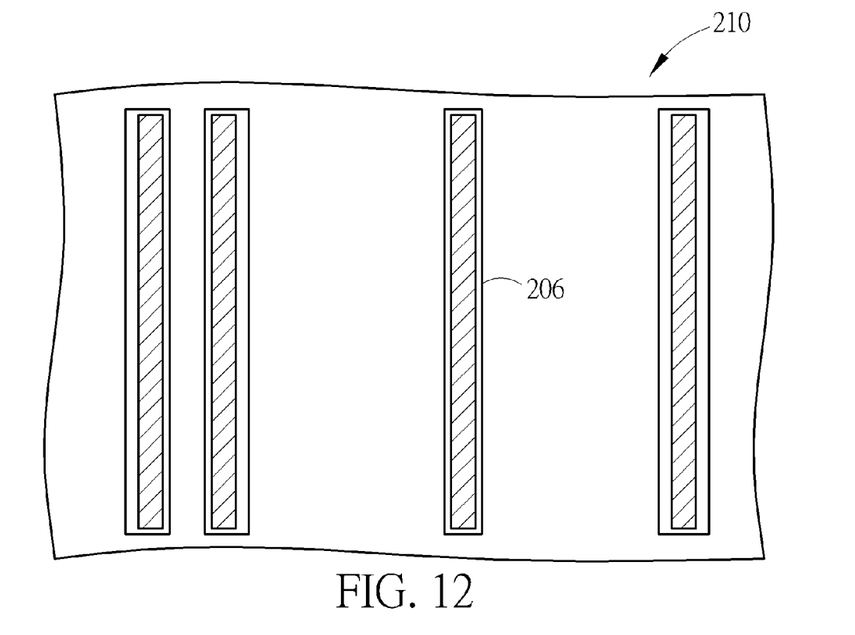

As shown in FIG. 12, the first selected pattern 206" is altered. In this exemplary embodiment, the adjustment of the first selected pattern 206" is reduced such that a boundary of the first selected pattern 206" may get closer to a boundary of the pattern 206 of the first sub-layout pattern 202 and, preferably, the adjustment of the first selected pattern 206" is reduced to be the same as the adjustment of the pattern of the corrected first sub-layout pattern 202' neighboring and connecting the first selected pattern 206", while the other patterns of the corrected first sub-layout pattern 202' (except for the first selected pattern 206") keep the original adjustment. Therefore, the corrected first sub-layout pattern 202' is modified as a third sub-layout pattern 210.

Figure 13:
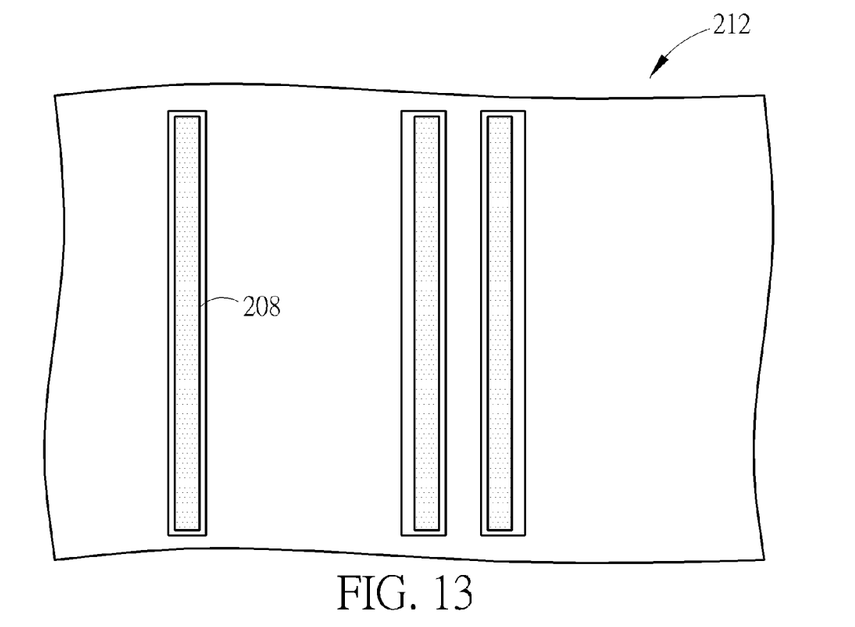

As shown in FIG. 13, the second selected pattern 208" is altered. In this exemplary embodiment, the adjustment of the second selected pattern 208" is reduced such that a boundary of the second selected pattern 208" may get closer to a boundary of the pattern 208 of the second sub-layout pattern 204, and preferably, the adjustment of the second selected pattern 208" is reduced to be the same as the adjustment of the pattern of the corrected second sub-layout pattern 204' neighboring and connecting the second selected pattern 208", while the other patterns of the corrected second sub-layout pattern 204' (except for the second selected pattern 208") keep the original adjustment. Therefore, the corrected second sub-layout pattern 204' is modified as a fourth sub-layout pattern 212. Afterwards, the process rule check (PRC) step is performed: if the third sub-layout pattern 210 and the fourth sub-layout pattern 212 obey the rules of the PRC, then the third sub-layout pattern 210 and the fourth sub-layout pattern 212 may be respectively outputted through the computer system to form a first mask (not shown) and a second mask (not shown).

In conclusion, the characteristic of the present invention is illustrated below. An inspection step is further performed on the layout pattern which has been processed by the OPC method (i.e. the corrected sub-layout pattern). More specifically, the corrected layout pattern is compared with the original layout pattern, and some patterns having excessive adjustments due to the OPC method are selected. Moreover, the selected patterns are further altered; for example, the adjustment of the selected pattern may be reduced. Accordingly, the mis-adjustment due to the OPC method can be avoided, the accuracy of the mask patterns can be increased, and a predetermined layout pattern can be further formed.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A method of optical proximity correction (OPC), comprising:
   providing a layout pattern to a computer system;
   classifying the layout pattern into at least a first sub-layout pattern and at least a second sub-layout pattern;
   respectively performing at least an OPC calculation on the first sub-layout pattern and the second sub-layout pattern to form a corrected first sub-layout pattern and a corrected second sub-layout pattern;
   comparing the corrected first sub-layout pattern with the layout pattern to select a part of the corrected first sub-layout pattern as a first selected pattern;
   altering the first selected pattern to modify the corrected first sub-layout pattern as a third sub-layout pattern;
   comparing the corrected second sub-layout pattern with the layout pattern to select a part of the corrected second sub-layout pattern as a second selected pattern;
   altering the second selected pattern to modify the corrected second sub-layout pattern as a fourth sub-layout pattern; and
   respectively outputting the third sub-layout pattern onto a first mask and the fourth sub-layout pattern onto a second mask through the computer system.

2. The method of OPC according to claim 1, wherein a method of selecting a part of the corrected first sub-layout pattern comprises:
   comparing the corrected first sub-layout pattern with the second sub-layout pattern; and
   calculating an interval between a pattern of the corrected first sub-layout pattern and a pattern of the second sub-layout pattern, wherein the pattern of the corrected first sub-layout pattern having the interval smaller than a predetermined value is selected as the first selected pattern.

3. The method of OPC according to claim 1, wherein a method of selecting a part of the corrected first sub-layout pattern comprises:
   comparing the corrected first sub-layout pattern with the second sub-layout pattern; and
   checking if a pattern of the corrected first sub-layout pattern overlaps a pattern of the second sub-layout pattern, wherein the pattern of the corrected first sub-layout pattern overlapping the pattern of the second sub-layout pattern is selected as the first selected pattern.

4. The method of OPC according to claim 1, wherein a method of selecting a part of the corrected second sub-layout pattern comprises:
   comparing the corrected second sub-layout pattern with the first sub-layout pattern; and
   calculating an interval between a pattern of the corrected second sub-layout pattern and a pattern of the first sub-layout pattern, wherein the pattern of the corrected second sub-layout pattern having the interval smaller than a predetermined value is selected as the second selected pattern.

5. The method of OPC according to claim 1, wherein a method of selecting a part of the corrected second sub-layout pattern comprises:
   comparing the corrected second sub-layout pattern with the first sub-layout pattern; and
   checking if a pattern of the corrected second sub-layout pattern overlaps a pattern of the first sub-layout pattern, wherein the pattern of the corrected second sub-layout pattern overlapping the pattern of the first sub-layout pattern is selected as the second selected pattern.

6. The method of OPC according to claim 1, wherein a method of selecting a part of the corrected first sub-layout pattern and a part of the corrected second sub-layout pattern comprises:
   comparing the corrected first sub-layout pattern with the corrected second sub-layout pattern; and
   calculating an interval between a pattern of the corrected first sub-layout pattern and a pattern of the corrected second sub-layout pattern, wherein the pattern of the corrected first sub-layout pattern and the pattern of the corrected second sub-layout pattern having the interval smaller than a predetermined value are respectively selected as the first selected pattern and the second selected pattern.

7. The method of OPC according to claim 1, wherein a method of selecting a part of the corrected first sub-layout pattern and a part of the corrected second sub-layout pattern comprises:
   comparing the corrected first sub-layout pattern with the corrected second sub-layout pattern; and
   checking if a pattern of the corrected first sub-layout pattern overlaps a pattern of the corrected second sub-layout pattern, wherein the pattern of the corrected first sub-layout pattern and the pattern of the corrected second sub-layout pattern overlapping each other are respectively selected as the first selected pattern and the second selected pattern.

8. The method of OPC according to claim 1, wherein a method of selecting a part of the corrected first sub-layout pattern comprises:
   classifying the layout pattern into at least a dense region and at least an isolated region;
   classifying the first sub-layout pattern into at least a dense region and at least an isolated region;
   comparing at least a pattern of the first sub-layout pattern in the isolated region with at least a pattern of the layout pattern in the dense region to find a same pattern, wherein a part of the corrected first sub-layout pattern corresponding to the same pattern is selected as the first selected pattern.

9. The method of OPC according to claim 8, wherein comparing at least a pattern of the first sub-layout pattern in the isolated region with at least a pattern of the layout pattern in the dense region comprises only comparing at least a pattern of the first sub-layout pattern in the isolated region with at least a pattern corresponding to the first sub-layout pattern and in the dense region of the layout pattern.

10. The method of OPC according to claim 1, wherein a method of selecting a part of the corrected second sub-layout pattern comprises:
    classifying the layout pattern into at least a dense region and at least an isolated region;
    classifying the second sub-layout pattern into at least a dense region and at least an isolated region;
    comparing at least a pattern of the second sub-layout pattern in the isolated region with at least a pattern of the layout pattern in the dense region to find a same pattern, wherein a part of the corrected second sub-layout pattern corresponding to the same pattern is selected as the second selected pattern.

11. The method of OPC according to claim 10, wherein comparing at least a pattern of the second sub-layout pattern in the isolated region with at least a pattern of the layout pattern in the dense region comprises only comparing at least a pattern of the second sub-layout pattern in the isolated region with at least a pattern corresponding to the second sub-layout pattern and in the dense region of the layout pattern.

* * * * *